United States Patent
Pan et al.

(10) Patent No.: US 7,711,504 B2
(45) Date of Patent: May 4, 2010

(54) METHOD AND SYSTEM FOR PERFORMING OPTICAL PROXIMITY CORRECTION WITH PROCESS VARIATIONS CONSIDERATIONS

(75) Inventors: Zhigang Pan, Austin, TX (US); Peng Yu, Austin, TX (US)

(73) Assignee: The Board of Regents, University of Texas System, Austin, TX (US)

( * ) Notice: Subject to any disclaimer, the term of this patent is extended or adjusted under 35 U.S.C. 154(b) by 0 days.

(21) Appl. No.: 11/923,927

(22) Filed: Oct. 25, 2007

(65) Prior Publication Data

US 2009/0030636 A1 Jan. 29, 2009

Related U.S. Application Data

(60) Provisional application No. 60/951,377, filed on Jul. 23, 2007.

(51) Int. Cl.
*G06F 17/50* (2006.01)
*G06F 17/00* (2006.01)
(52) U.S. Cl. .................... 702/85; 702/107; 716/11
(58) Field of Classification Search ............ 702/85, 702/107
See application file for complete search history.

(56) References Cited

U.S. PATENT DOCUMENTS

| 7,080,349 | B1* | 7/2006 | Babcock et al. | 716/19 |
| 7,360,199 | B2* | 4/2008 | Scaman | 716/19 |
| 2005/0278685 | A1* | 12/2005 | Granik et al. | 716/19 |
| 2006/0085772 | A1* | 4/2006 | Zhang | 716/4 |
| 2008/0086715 | A1* | 4/2008 | Zach | 716/19 |
| 2008/0309897 | A1* | 12/2008 | Wong et al. | 355/44 |

\* cited by examiner

*Primary Examiner*—Hal D Wachsman
(74) *Attorney, Agent, or Firm*—Anthony P. Ng; Dillon & Yudell LLP

(57) ABSTRACT

A method for performing optical proximity correction with process variations considerations is disclosed. The maximum aerial gradient direction for a control point associated with an edge is initially determined. Then, a variational edge placement error $\langle E \rangle$ along the maximum aerial image intensity gradient direction of the control point is calculated. A determination is made whether or not $|C\langle E\rangle \cdot n|$ is equal to or greater than a manufacturing grid, where n is the direction perpendicular to a segment pointing outward, and C is a constant. If $|C\langle E\rangle \cdot n|$ is equal to or greater than a manufacturing grid, the edge is moved by $-C\langle E\rangle \cdot n$.

12 Claims, 5 Drawing Sheets

METHOD AND SYSTEM FOR PERFORMING OPTICAL PROXIMITY CORRECTION WITH PROCESS VARIATIONS CONSIDERATIONS

RELATED APPLICATION

The present application claims priority under 35 U.S.C. §119(e)(1) to provisional application No. 60/951,377 filed on Jul. 23, 2007, the contents of which are incorporated herein by reference.

BACKGROUND OF THE INVENTION

1. Technical Field

The present invention relates to photolithographic printing in general, and, in particular, to a method and system for performing optical proximity correction with process variations considerations.

2. Description of Related Art

When transferring an integrated circuit design pattern onto a semiconductor substrate, the most common technique is to produce a photomask with a photomask layout of the integrated circuit design, and then a lithography process is utilized to expose the patterns of the photomask layout to a semiconductor substrate in a predetermined ratio.

As integrated circuit designs become more complex, the number of circuit elements to be produced on a wafer become increasingly large and each object becomes correspondingly smaller. As the size of the objects to be produced become similar in size or smaller than the wavelength of light used to illuminate the wafer, distortions occur whereby the pattern of objects formed on the wafer do not correspond to the pattern of objects defined by the mask. One objective criterion for defining how well an image is formed or an object is produced is the edge placement error (EPE) that indicates how far an edge of an object is shifted from its desired position. Another objective criterion is the edge contrast or slope that describes how sharply the image intensity changes from exposed to not exposed, or vice versa.

In order to improve the manufacturability of target layout designs, optical process correction (OPC) techniques have been developed that alter a mask layout pattern in order to correctly create the desired pattern of objects on a wafer. The conventional OPC method of improving the fidelity of a layout is to simulate how a pattern of polygon fragments fabricated on a mask will be lithographically reproduced as corresponding edges on the wafer, and then moves the fragment such that the edge on the wafer will be created at the proper location.

In a typical OPC procedure, a target layout includes several polygons that represents the objects desired on the wafer. Referring now to the drawings and in particular to FIG. 1A, there is illustrated a fragmented polygon in a target layout. As shown, a polygon 10 is divided up into edges 12a-12f. For each of edges 12a-12f, at least one control point (or simulation site) is designated. For example, a control point 13c is designated to edge 12c, and a control point 13d is designated to edge 12d. Although there is typically one site per edge, some edges may have more than one simulation site.

Simulations are generated at each of the sites of the edges, usually along a cut line perpendicular to the edge, and measurements of the predicted image slope, maximum and minimum intensities are calculated as shown in FIG. 1B. From these image parameters, the actual placement of the edge is predicted using techniques such as the variable threshold resist model. The edge location as predicted and the location of the ideal edge in the target layout are then compared in order to calculate the difference as an edge placement error (EPE).

Changes are then made in the mask layout to minimize the calculated EPE. For each edge, a fragment in the mask layout is designated, and each mask fragment is moved in an attempt to reduce the calculated EPE. New simulations at the sites are generated again from the revised mask layout, and new EPEs are calculated. This procedure is repeated iteratively until EPE falls within an acceptable tolerance value.

Conventional model-based OPC assumes nominal process conditions without considering any process variations due to the current lack of variational lithography models. However, disregarding process variations may lead to erroneous timing, power and yield characterization analysis. For example, post-OPC silicon image based timing analysis is found to be substantially different from that based on the drawn layout.

Consequently, it would be desirable to provide an improved method and system for performing OPC with process variations considerations.

SUMMARY OF THE INVENTION

In accordance with a preferred embodiment of the present invention, the maximum aerial gradient direction for a control point associated with an edge is initially determined. Then, a variational edge placement error $\langle E \rangle$ along the maximum aerial image intensity gradient direction of the control point is calculated. A determination is made whether or not $|C\langle E\rangle \cdot n|$ is equal to or greater than a manufacturing grid, where n is the direction perpendicular to a segment pointing outward, and C is a constant. If $|C\langle E\rangle \cdot n|$ is equal to or greater than a manufacturing grid, the edge is moved by $-C\langle E\rangle \cdot n$.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

Figure 1A:
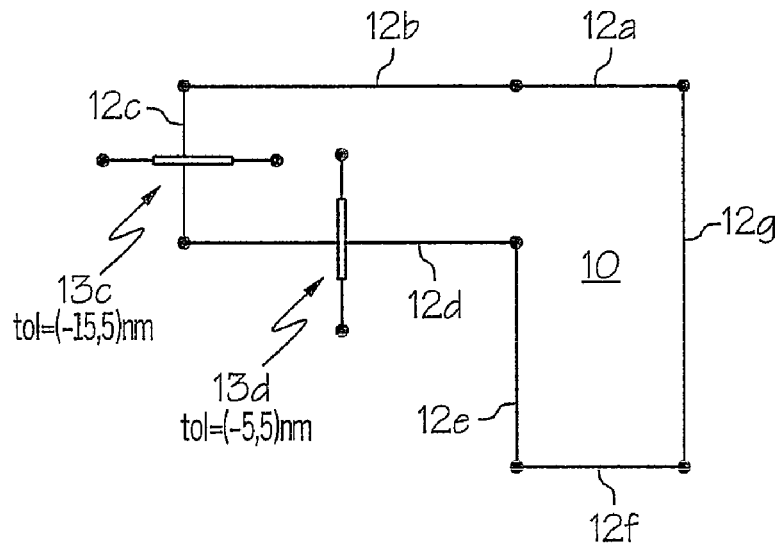
FIGS. 1A-1B illustrate a fragmented polygon in a target layout and a measurement of an edge placement error computed for a simulation site of an edge, respectively, according to the prior art.
Figure 1B:
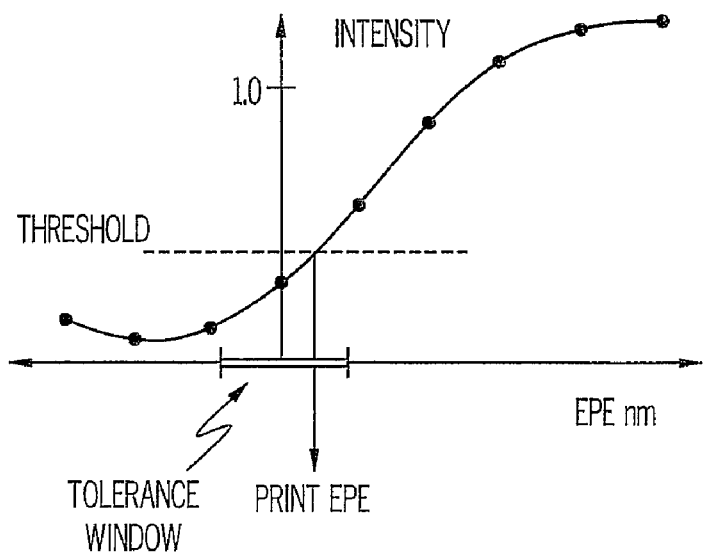
Figure 2:
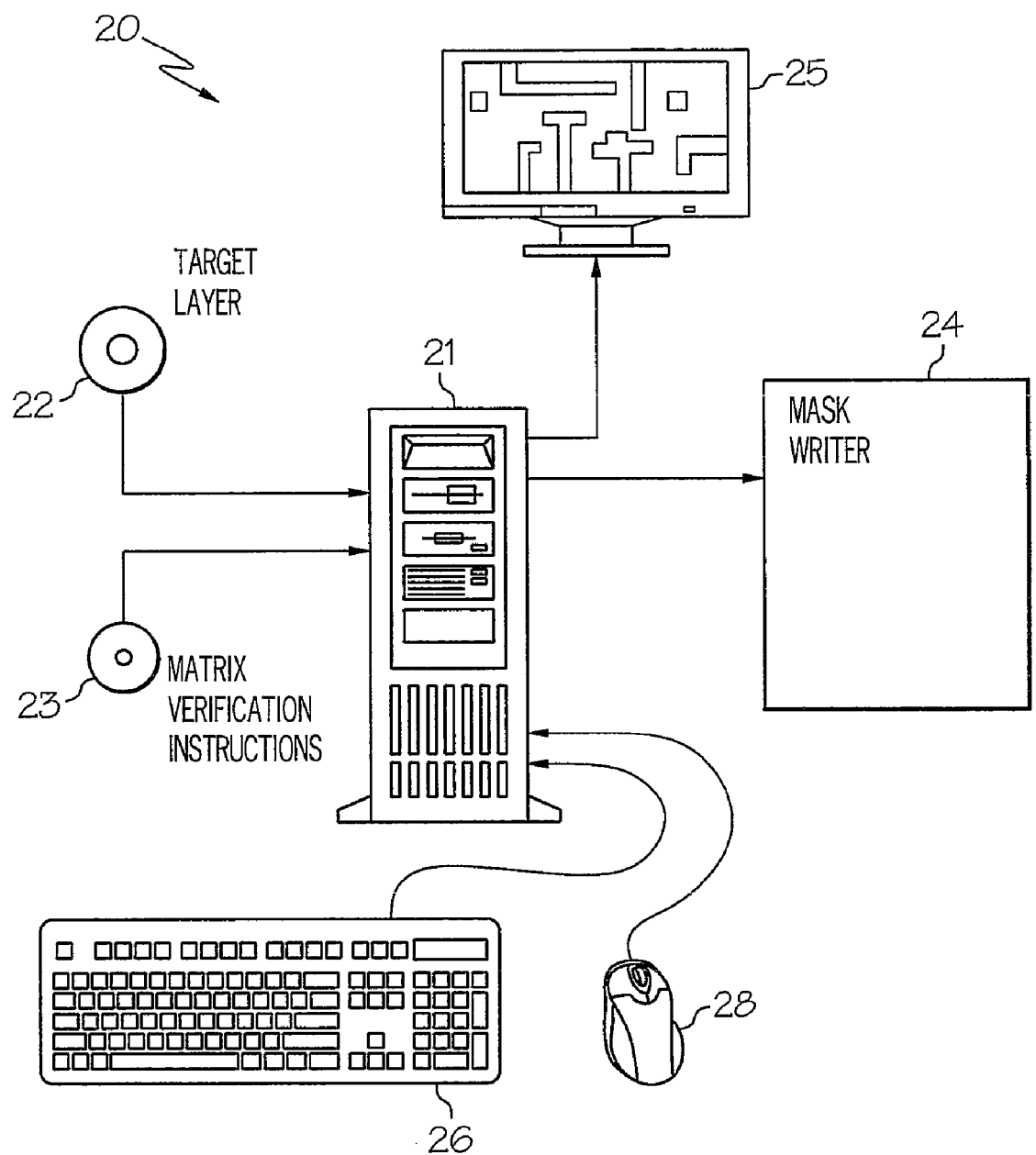
FIG. 2 is a block diagram of a computer system in which a preferred embodiment of the present invention is incorporated.

With reference now to FIG. 2, there is depicted a block diagram of a computer system in which a preferred embodiment of the present invention is incorporated. As shown, a computer system 20 includes a processing unit 21 connected to a display 25, a keyboard 26 and a mouse 28. Instructions used by processing unit 21 to implement the optical proximity correction technique of the present invention are received on a computer readable media 23 or can be received as a communication signal from a remote computer over a wired or wireless data link. Processing unit 21 receives a target layer description that defines a number of circuit elements to be manufactured on a semiconductor wafer. The target layer description is received on a computer readable media 22 or can be received from a remote computer over a wired or wireless data communication link. Processing unit 21 generates a mask layout description of one or more lithographic masks that will be used to expose desired portions of a wafer in order to manufacture circuit elements on the semiconductor wafer. The mask layout is exported to a mask writer 24 that produces the physical mask(s) to be used in a wafer processing facility.

Figure 3:
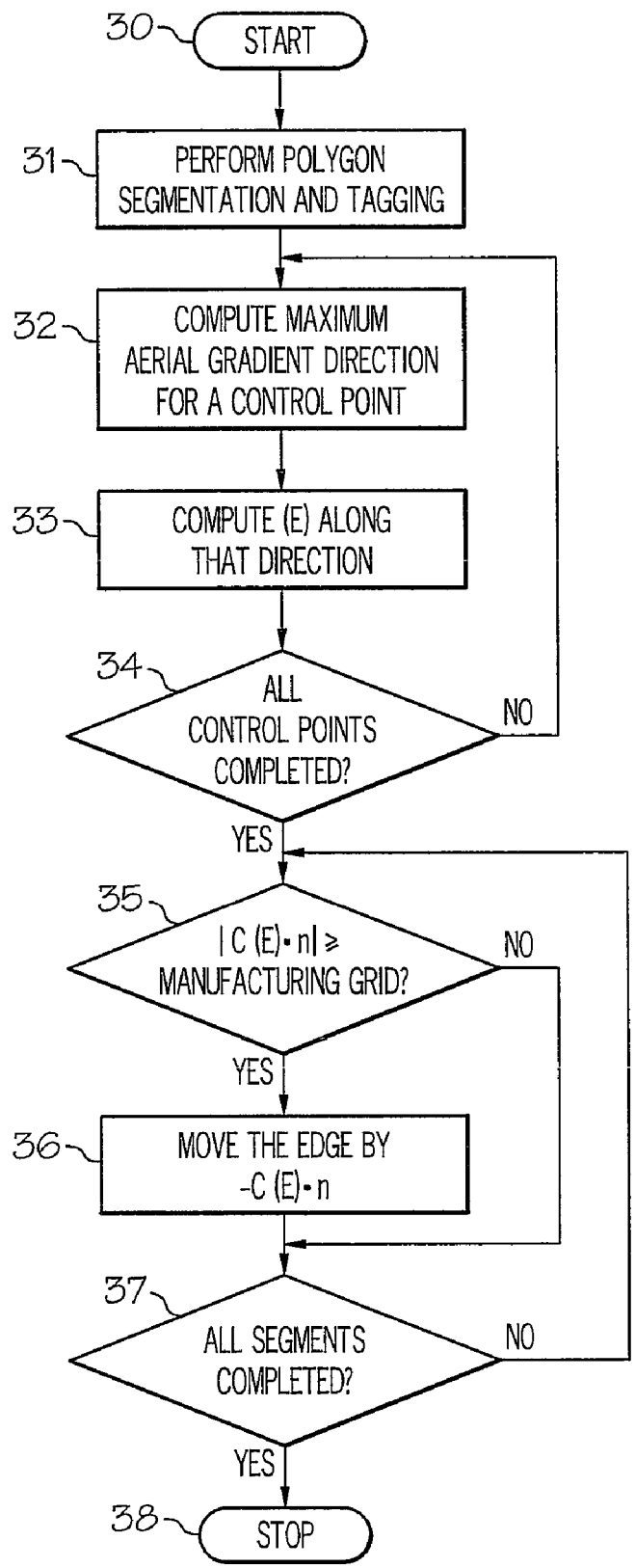
FIG. 3 is a high-level logic flow diagram of a method for performing optical process correction with process variations considerations, in accordance with a preferred embodiment of the present invention.

Referring now to FIG. 3, there is depicted a high-level logic flow diagram of a method for performing optical process correction (OPC) with process variations considerations, in accordance with a preferred embodiment of the present invention. Starting at block 30, polygon segmentation and tagging are performed, as shown in block 31. Polygon segmentation and tagging can be performed by conventional OPC segmentation and tagging strategies that are well-known in the art.

Figure 4A:
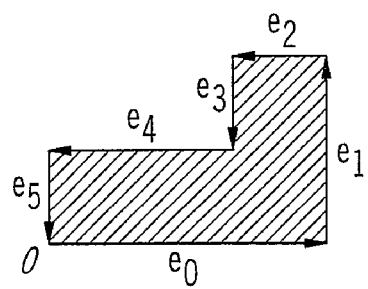
FIGS. 4A-4B are rectilinear polygon representations.
Figure 4B:
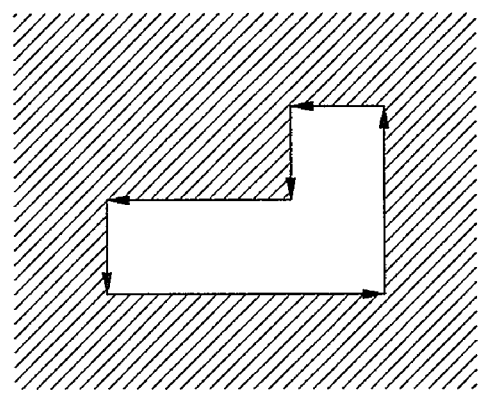

Polygons are parametrized such that they can be efficiently changed. FIGS. 4A-4B are examples of rectilinear polygon representations. Each of the rectilinear polygons shown in FIGS. 4A-4B is composed of a series of directed edges, and each edge is represented as a triplet $e_i = \{l_i, h_i, p_i\}$. A rectilinear polygon can be represented as $\{O, c, \{e_i | 0 \leq i < N\}\}$, and for the present example, N=6. The head of each edge $e_i$ is connected to the tail of a next edge ($e_{mod(i+1,N)}$), where N is the number of edges and mod denotes the modulo operation. Each edge can be specified by its length l and two Boolean variables h and p, where h indicates whether it is horizontal or vertical and p indicates whether it points to the positive direction (x or y) or the negative direction (-x or -y). The per polygon Boolean variable indicates whether the interior of the region is to the left or to the right of the edges of the rectilinear polygon. O denotes the starting point of the first edge ($e_0$).

Figure 5:
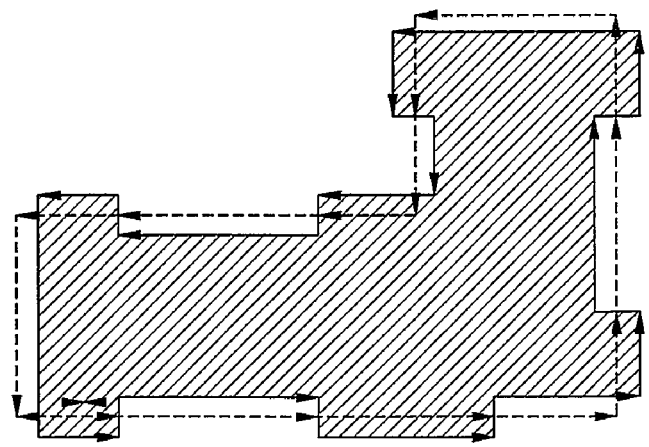
FIG. 5 shows that the polygon in FIG. 4B is segmented into many small segments.

FIG. 5 shows that the rectilinear polygon in FIG. 4B is segmented into many small segments, denoted as dashed arrows. In addition to parameters $\{l_i, h_i, p_i\}$, one more parameter $d_i$ should be used to describe the displacement of the segment from its original location. By applying $d_i$'s to each segment, the segments are shifted to the locations denoted as solid arrows. The vertices needed in lithography simulators can be computed based on such representation. Although only rectilinear polygons are described, the above-mentioned technique can be extended to polygons having 45° edges.

Referring back to FIG. 3, the maximum aerial gradient direction is then computed for each control point on one layer, as depicted in block 32. A variation edge placement error (EPE) $\langle E \rangle$ along the maximum aerial image intensity gradient direction of a corresponding control point is then calculated, as shown in block 33.

Figure 6A:
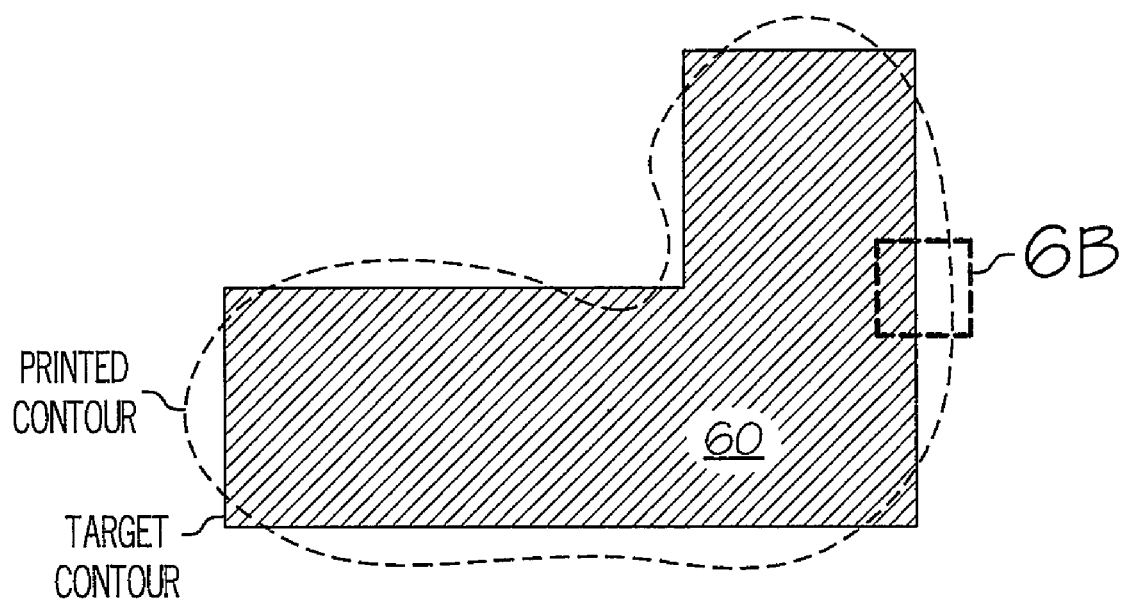
FIGS. 6A-6B illustrate the concept of edge placement error, in accordance with a preferred embodiment of the present invention.
Figure 6B:
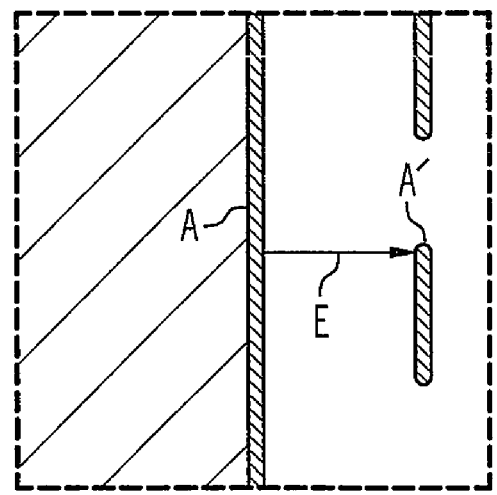

For any given point on the target contour, its variational EPE is defined as the placement between that point and its nearest printed contour point. For example, a shape 60 is defined by a target contour in solid lines, as shown in FIG. 6A. The printed contour in illustrated in dashed lines. A portion of the rightmost edge of shape 60 is enlarged to depict a point A on the target contour, as depicted in FIG. 6B. A point A' is point A's closest point on the printed contour. Thus, point A's variational EPE is defined as the placement between point A and point A' on the printed contour point. The variational EPE for point A on the target contour is denoted as E. The printed contour is uniquely determined if the variational EPEs of all the target contour points are given. At a certain intensity threshold, the printed contour is the least sensitive to the focus variations, and such intensity threshold is called the iso-focal threshold denoted as $I_{th_{iso}}$, defined as $$\frac{\partial E|_{I=I_{th_{iso}}}}{\partial z} = 0$$

Assuming small $I_{th}$ variations and small z variations, E can be written as where $$a_0 = \frac{E_t - E_{iso}}{I_0(E_t) - I_{th_{iso}}}$$

$$a_1 = \frac{I_2(E_t)}{I_0(E_t) - I_{th_{iso}}}$$

As an example, when the joint distribution of measured exposure dose E and focus error Z for an actual manufacturing process are available, the joint distribution of $I_{th}$ and z can be computed as follows $$I_{th} = \frac{\beta_E}{E - \alpha_E}$$

$$z = \beta_z(Z - \alpha_z)$$

If $I_{th}$ and z are assumed to be independent and normally distributed, i.e., $z \sim N(0, \sigma_z^2)$ and $I_{th} \sim N(\mu_{Ith}, \sigma_{th}^2)$, the variational EPE $\langle E \rangle$ can be calculated as follows:

$$\langle E \rangle = E_{iso} + a_0(1 + a_1\sigma_z^2)(\mu_{I_{th}} - I_{th_{iso}})$$
$$= E_{iso} + a_0(\mu_{I_{th}} - I_{th_{iso}}) + a_0 a_1 \sigma_z^2(\mu_{I_{th}} - I_{th_{iso}})$$
$$= E_{norm} + \mu_E$$

where $E_{norm}$ is the nominal EPE.

After all the control points have been completed, a determination is made, for each edge, as to whether or not $|C\langle E \rangle \cdot n|$ is equal to or greater than a manufacturing grid, where n is the direction perpendicular to the segment pointing outward, and C is a constant preferably chosen by a user based on accuracy and convergent speed, as shown in block 35. If $|C\langle E \rangle \cdot n|$ is equal to or greater than a manufacturing grid, then the edge is moved by $-C\langle E \rangle \cdot n$, as depicted in block 36. The edge movement is preferably rounded to a multiple of manufacturing grid. Otherwise, if $|C\langle E \rangle \cdot n|$ is less than a manufacturing grid, the process proceeds to block 37 for a new edge. The process is stop after all segments within a layer have been completed, as shown in block 38. The process may start again for a new layer.

As has been described, the present invention provides a method and system for performing OPC with process variations considerations.

It is also important to note that although the present invention has been described in the context of a fully functional computer system, those skilled in the art will appreciate that the mechanisms of the present invention are capable of being distributed as a program product in recordable type media such as compact disks.

While the invention has been particularly shown and described with reference to a preferred embodiment, it will be understood by those skilled in the art that various changes in form and detail may be made therein without departing from the spirit and scope of the invention.

What is claimed is:

1. A method for performing optical proximity correction, said method comprising:
   receiving a layout file by a computer system, wherein said layout file contains a plurality of polygons that represents integrated circuits desired to be manufactured on a wafer;
   determining by a processing unit within said computer system a maximum aerial image intensity gradient direction for a control point associated with a segment of a polygon within said layout file;
   determining by said processing unit a variational edge placement error $\langle E \rangle$ along said maximum aerial image intensity gradient direction of said control point;
   determining by said processing unit whether or not $|C\langle E\rangle \cdot n|$ is equal to or greater than a manufacturing grid, where n is a direction perpendicular to said segment pointing outward, and C is a value selectable by a user;
   in a determination that $|C\langle E\rangle \cdot n|$ is equal to or greater than said manufacturing grid, moving by said processing unit an edge of said segment by $-C\langle E\rangle n$; and
   generating by said processing unit a target layout file for a mask writer after said $|C\langle E\rangle \cdot n|$ determination have been performed on all of said polygons within said layout file.

2. The method of claim 1, wherein said method further includes in a determination that $|C\langle E\rangle \cdot n|$ is less than said manufacturing grid, repeating said $|C\langle E\rangle \cdot n|$ determination for a new segment within said polygon.

3. The method of claim 1, wherein said variational edge placement error $\langle E \rangle$ is determined by $$\langle E \rangle = E_{iso} + a_0(1 + a_1\sigma_z^2)(\mu_{I_{th}} - I_{th_{iso}})$$
$$= E_{iso} + a_0(\mu_{I_{th}} - I_{th_{iso}}) + a_0 a_1 \sigma_z^2 (\mu_{I_{th}} - I_{th_{iso}})$$
$$= E_{norm} + \mu_E$$

where $E_{norm}$ is the nominal EPE.

4. The method of claim 1, wherein C is chosen to achieve a balance between speed and accuracy.

5. A computer readable storage medium having a computer program product for instructing a processor to perform steps of optical proximity correction, said steps comprising:
   receiving a layout file containing a plurality of polygons that represents integrated circuits desired to be manufactured on a wafer;
   determining a maximum aerial image intensity gradient direction for a control point associated with a segment of a polygon within said layout file;
   determining a variational edge placement error $\langle E \rangle$ along said maximum aerial image intensity gradient direction of said control point;
   determining whether or not $|C\langle E\rangle \cdot n|$ is equal to or greater than a manufacturing grid, where n is a direction perpendicular to said segment pointing outward, and C is a value selectable by a user;
   in a determination that $|C\langle E\rangle \cdot n|$ is equal to or greater than said manufacturing grid, moving an edge of said segment by $-C\langle E\rangle n$; and
   generating a target layout file after said $|C\langle E\rangle \cdot n|$ determination have been performed on all of said polygons within said layout file.

6. The computer readable storage medium of claim 5, wherein said steps further includes in a determination that $|C\langle E\rangle \cdot n|$ is less than said manufacturing grid, repeating said $|C\langle E\rangle \cdot n|$ determination for a new segment within said polygon.

7. The computer readable storage medium of claim 5, wherein said variational edge placement error $\langle E \rangle$ is determined by $$\langle E \rangle = E_{iso} + a_0(1 + a_1\sigma_z^2)(\mu_{I_{th}} - I_{th_{iso}})$$
$$= E_{iso} + a_0(\mu_{I_{th}} - I_{th_{iso}}) + a_0 a_1 \sigma_z^2 (\mu_{I_{th}} - I_{th_{iso}})$$
$$= E_{norm} + \mu_E$$

where $E_{norm}$ is the nominal EPE.

8. The computer readable storage medium of claim 5, wherein C is chosen to achieve a balance between speed and accuracy.

9. A computer system comprising:
   an input device;
   an output device;
   a processing unit, coupled to said input and output devices, having
      means for receiving a layout file containing a plurality of polygons that represents integrated circuits desired to be manufactured on a wafer;
      means for determining maximum aerial gradient direction for a control point associated with a segment of a polygon within said layout file;
      means for determining a variational edge placement error $\langle E \rangle$ along the maximum aerial image intensity gradient direction of said control point;
      means for determining whether or not $|C\langle E\rangle \cdot n|$ is equal to or greater than a manufacturing grid, where n is a direction perpendicular to said segment pointing outward, and C is a value selectable by a user;
      means for, in a determination that $|C\langle E\rangle \cdot n|$ is equal to or greater than said manufacturing grid, moving an edge of said segment by $-C\langle E\rangle \cdot n$; and
      means for generating a target layout file after said $|C\langle E\rangle \cdot n|$ determination have been performed on all of said polygons within said layout file.

10. The computer system of claim 9, wherein said processing unit further includes means for, in a determination that $|C\langle E\rangle \cdot n|$ is less than said manufacturing grid, repeating said $|C\langle E\rangle \cdot n|$ determination for a new segment within said polygon.

11. The computer system of claim 9, wherein said variational edge placement error $\langle E \rangle$ is determined by $$\langle E \rangle = E_{iso} + a_0(1 + a_1\sigma_z^2)(\mu_{I_{th}} - I_{th_{iso}})$$
$$= E_{iso} + a_0(\mu_{I_{th}} - I_{th_{iso}}) + a_0 a_1 \sigma_z^2 (\mu_{I_{th}} - I_{th_{iso}})$$
$$= E_{norm} + \mu_E$$

where $E_{norm}$ is the nominal EPE.

12. The computer system of claim 9, wherein C is chosen to achieve a balance between speed and accuracy.

* * * * *